(12) United States Patent
Zhao et al.

(10) Patent No.: US 11,914,344 B2
(45) Date of Patent: Feb. 27, 2024

(54) METHOD AND APPARATUS FOR CONTROLLING HYBRID PROCESS RECIPES, AND MEDIUM

(71) Applicant: CHANGXIN MEMORY TECHNOLOGIES, INC., Hefei (CN)

(72) Inventors: Xingle Zhao, Hefei (CN); Yuming Wang, Hefei (CN); Zhengqing Sun, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 115 days.

(21) Appl. No.: 17/658,714

(22) Filed: Apr. 11, 2022

(65) Prior Publication Data
US 2023/0050040 A1   Feb. 16, 2023

(30) Foreign Application Priority Data
Aug. 16, 2021   (CN) .......................... 202110939450.7

(51) Int. Cl.
*G05B 19/4155* (2006.01)

(52) U.S. Cl.
CPC ............... *G05B 19/4155* (2013.01); *G05B 2219/45212* (2013.01)

(58) Field of Classification Search
None
See application file for complete search history.

(56) References Cited

U.S. PATENT DOCUMENTS

| | | | | |
|---|---|---|---|---|
| 2002/0098600 A1* | 7/2002 | Yao | ................... | H01L 21/67276 257/E21.525 |
| 2004/0034648 A1* | 2/2004 | Hsu | ................... | G05B 19/41865 707/999.102 |
| 2013/0310960 A1* | 11/2013 | Chang | .............. | G05B 19/41865 707/E17.014 |

FOREIGN PATENT DOCUMENTS

CN   106292557 B   10/2018

* cited by examiner

*Primary Examiner* — Ryan A Jarrett
(74) *Attorney, Agent, or Firm* — Cooper Legal Group, LLC (57) ABSTRACT

Embodiments of the present disclosure provide a control method and apparatus for hybrid process recipes, and a device and a medium. The control method includes: acquiring hybrid process recipe operation groups associated with process recipes operated by etching chambers of an etching machine, where different process recipes correspond to different hybrid process recipe operation groups; acquiring a switching rule of different hybrid process recipe operation groups; and controlling, based on a reserved process recipe for a real-time reserved demand of a target etching chamber and a requirement of the switching rule, the etching machine to automatically switch to a target hybrid process recipe operation group associated with the reserved process recipe.

20 Claims, 6 Drawing Sheets

METHOD AND APPARATUS FOR CONTROLLING HYBRID PROCESS RECIPES, AND MEDIUM

CROSS-REFERENCE TO RELATED APPLICATION

This disclosure claims the priority of Chinese Patent Application No. 202110939450.7, submitted to the Chinese Intellectual Property Office on Aug. 16, 2021, the disclosure of which is incorporated herein in its entirety by reference.

TECHNICAL FIELD

Embodiments of the present disclosure relate to the technical field of semiconductor manufacturing, and in particular to a control method and apparatus for hybrid process recipes, and a device and a medium.

BACKGROUND

With the rapid development of integrated circuit (IC) manufacturing processes, the market demand for semiconductor products is increasing, which puts forward higher requirements on the output efficiency and quality of semiconductor production lines. The output efficiency and yield of the etching process, one of the key processes for semiconductor production, directly affect those of the semiconductor products. The etching process in the semiconductor industry generally adopts a multi-chamber multi-recipe switching workflow to improve the production efficiency and utilization of the etching machine.

In the multi-chamber multi-recipe switching workflow of the traditional etching process, before an etching chamber is switched, the process recipe not operated by the etching chamber is disabled by an engineer. After the relevant departments determine the procedure of manual process recipe switching, an operator regulates and tests a new etching chamber according to the operation requirements of the reserved process recipe. After the new etching chamber satisfies the operation requirements, the engineer disables the former process recipe, and enables the reserved process recipe.

Manual operations are prone to errors or omissions, resulting in unnecessary economic losses. Moreover, the same etching chamber of the etching machine may be designed to operate different process recipes, and the etching machine needs to stop the current etching process recipe before switching to a new etching process recipe, resulting in idling and capacity loss of the etching machine.

SUMMARY

According to some embodiments, a first aspect of the present disclosure provides a control method for hybrid process recipes, including:
acquiring hybrid process recipe operation groups associated with process recipes operated by etching chambers of an etching machine, where different process recipes correspond to different hybrid process recipe operation groups;
acquiring a switching rule of different hybrid process recipe operation groups; and
controlling, based on a reserved process recipe for a real-time reserved demand of a target etching chamber and a requirement of the switching rule, the etching machine to automatically switch to a target hybrid process recipe operation group associated with the reserved process recipe.

A second aspect of the present disclosure provides a control apparatus for hybrid process recipes. The control apparatus includes one or more processors; and a storage apparatus, configured to store one or more programs, wherein the one or more programs, when executed by the one or more processors, cause the one or more processors to execute operations of: acquiring hybrid process recipe operation groups associated with process recipes operated by etching chambers of an etching machine, where different process recipes correspond to different hybrid process recipe operation groups; acquiring a switching rule of different hybrid process recipe operation groups; and controlling, based on a reserved process recipe for a real-time reserved demand of a target etching chamber and a requirement of the switching rule, the etching machine to automatically switch to a target hybrid process recipe operation group associated with the reserved process recipe.

A third aspect of the present disclosure provides a computer-readable storage medium. The computer-readable storage medium stores a computer program, where the computer program is executed by a processor to implement the steps of the control method according to any one of the above embodiments.

BRIEF DESCRIPTION OF THE DRAWINGS

To describe the technical solutions in the embodiments of the present disclosure more clearly, the drawings required to describe the embodiments are briefly described below. Apparently, the drawings described below are only some embodiments of the present disclosure. Those of ordinary skill in the art may further derive drawings of other embodiments based on these drawings without creative efforts.

DETAILED DESCRIPTION

To facilitate the understanding of the present disclosure, the present disclosure is described more comprehensively below with reference to the drawings. The preferred embodiments of the present disclosure are shown in the drawings. However, the present disclosure may be embodied in various forms without being limited to the embodiments described herein. On the contrary, these embodiments are provided to make the present disclosure more thorough and comprehensive.

Unless otherwise defined, all technical and scientific terms used herein have the same meaning as commonly understood by those skilled in the technical field of the present disclosure. The terms mentioned herein are merely for the purpose of describing specific embodiments, rather than to limit the present disclosure. The term "and/or" used herein includes any and all combinations of one or more of the associated listed items.

When an element is described herein by terms such as "including", "having" and "comprising", unless an explicit qualifying term such as "only" or "consisting of" is used, another element may also be included. Unless mentioned to the contrary, terms in the singular may include the plural and should not be construed as having a number of one.

It is understandable that the terms such as "first" and "second" used herein may be used to describe various elements, but these elements are not limited by these terms. Instead, these terms are merely intended to distinguish one element from another. For example, without departing from the scope of the present disclosure, a first element may be referred to as a second element, and similarly, a second element may be referred to as a first element.

In the present disclosure, it should be noted that, unless otherwise clearly specified, the terms "provided", "connected with" and "connected to" should be understood in a broad sense. For example, the connection may be a fixed connection, a detachable connection or an integrated connection, may be a direct connection or an indirect connection via an intermediate medium, or may be intercommunication between two components. Those of ordinary skill in the art should understand the specific meanings of the above terms in the present disclosure based on specific situations.

In order to improve the output efficiency and yield of the etching process, the etching machine is provided with a plurality of etching chambers. When different processes are performed in different etching chambers, due to manual operation errors, the wafer may be sent to an improper etching chamber, or the etching machine may perform an improper process. This will lead to wafer scrap or yield reduction, and even adversely affect the etching machine, resulting in unnecessary economic losses. In addition, a plurality of operators are involved in the switching process, which requires close cooperation between the operators. Procrastination by any operator will result in an extended switching cycle, thereby prolonging the idle time of the etching machine.

The present disclosure aims to provide a control method and apparatus for hybrid process recipes, and a device and a medium. The present disclosure can control an etching machine to automatically switch to a target hybrid process recipe operation group according to the operation requirements of a reserved process recipe, so as to avoid machine shutdown and manual operation errors during process recipe switching. The present disclosure effectively improves the production efficiency and yield of the etching process, thereby further improving the output efficiency and quality of the semiconductor production line.

Figure 1:
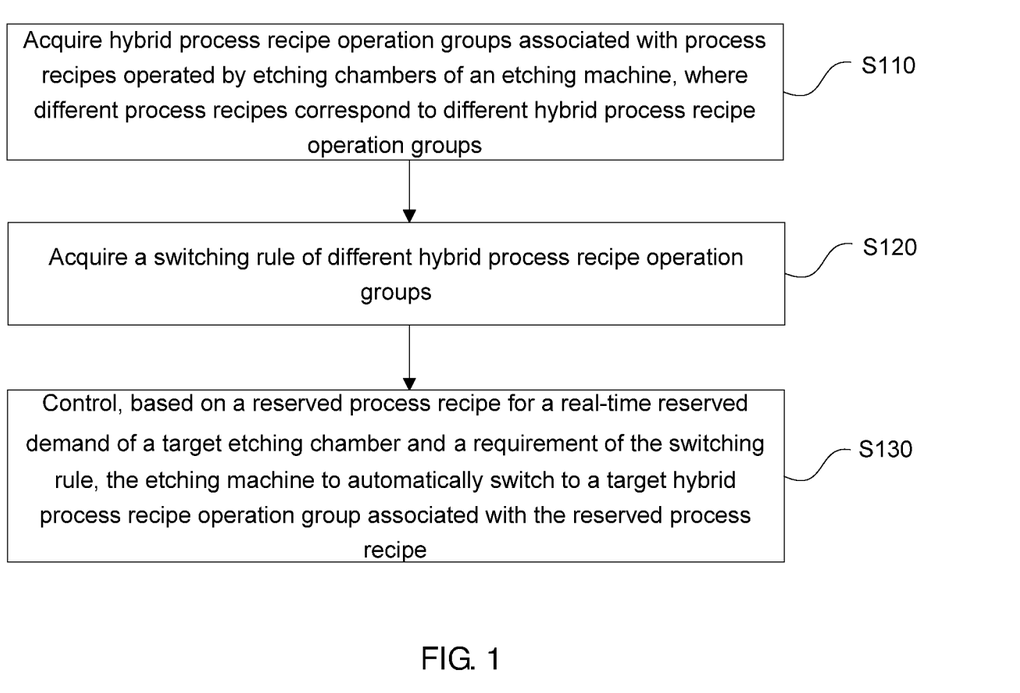
FIG. 1 is a flowchart of a control method for hybrid process recipes according to a first embodiment of the present disclosure.

Referring to FIG. 1, an embodiment of the present disclosure provides a control method for hybrid process recipes, including:

S110: Acquire hybrid process recipe operation groups associated with process recipes operated by etching chambers of an etching machine, where different process recipes correspond to different hybrid process recipe operation groups.

S120: Acquire a switching rule of different hybrid process recipe operation groups.

S130: Control, based on a reserved process recipe for a real-time reserved demand of a target etching chamber and a requirement of the switching rule, the etching machine to automatically switch to a target hybrid process recipe operation group associated with the reserved process recipe.

Specifically, referring to FIG. 1, the etching machine may include a plurality of different etching chambers, and a plurality of different etching chambers simultaneously execute corresponding process recipes, so as to improve the efficiency of the etching machine executing the hybrid process recipes. The hybrid process recipe operation group associated with the process recipe operated by the etching chamber in the etching machine is acquired, where different process recipes correspond to different hybrid process recipe operation groups. After acquiring the switching rule of different hybrid process recipe operation groups, a manufacturing execution system controls the etching machine to automatically switch to a target hybrid process recipe operation group associated with a reserved process recipe, based on the reserved process recipe for a real-time reserved demand and a requirement of the switching rule. The switching process does not require manual participation and does not require the etching machine to stop operating the process recipe, so as to avoid economic losses caused by machine shutdown, manual operation errors or omissions during process recipe switching. Since different process recipes correspond to different hybrid process recipe operation groups, during a dispatch reservation period of a dispatch system, a process recipe that does not belong to the target hybrid process recipe operation group corresponding to the target etching chamber cannot be successfully reserved. This avoids the problem that a target etching chamber determined by an automatic reservation does not correspond to the reserved process recipe for a real-time reserved demand, thereby avoiding production loss.

As an example, in an embodiment of the present disclosure, the switching rule may be set to include: an etching rate of the target etching chamber is within a target etching rate range required by the reserved process recipe; and/or a particle content of the target etching chamber is within a target particle content range required by the reserved process recipe. The etching rate and particle content of the etching chamber determine the output efficiency and yield of the etching chamber. By determining whether the etching rate of the etching chamber is within the target etching rate range and/or whether the particle content is within the target particle content range, it can be determined whether the etching chamber satisfies the requirement of the switching rule for switching to the target etching chamber. This design realizes automatic switching of different process recipes in the same etching chamber and automatic switching between different etching chambers.

As an example, in an embodiment of the present disclosure, the switching rule may be set to include: a target etching rate on a silicon nitride film is 44 Å/min to 46 Å/min. For example, the target etching rate on the silicon nitride film may be 44 Å/min, 45 Å/min, 46 Å/min, etc. Before switching, the etching chamber may be warmed up until the etching rate on the silicon nitride film in the etching chamber is 44 Å/min to 46 Å/min, to ensure that the determined target etching chamber satisfies the requirements of the reserved process recipe and the switching rule. Then, the etching machine is controlled to automatically switch to the target hybrid process recipe operation group to execute the reserved process recipe.

As an example, in an embodiment of the present disclosure, the process recipes for the same film are associated with the same hybrid process recipe operation group. Thus, the same film is subjected to the process recipe in the same etching chamber, so as to avoid the efficiency reduction of the etching machine caused by switching the etching chamber for the same film.

Figure 2:
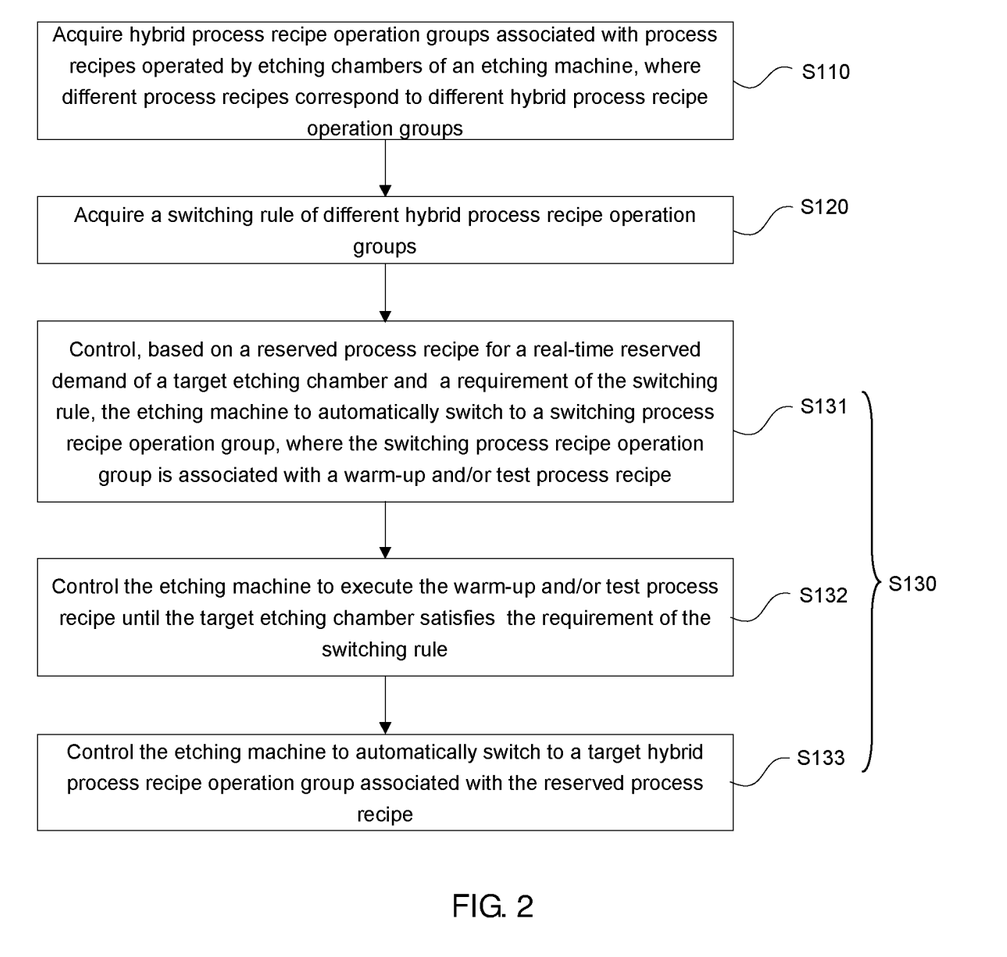
FIG. 2 is a flowchart of a control method for hybrid process recipes according to a second embodiment of the present disclosure.

Further, referring to FIG. 2, in an embodiment of the present disclosure, S130 includes:

S131: Control, based on the reserved process recipe for the real-time reserved demand of the target etching chamber and the requirement of the switching rule, the etching machine to automatically switch to a switching preparation process recipe operation group, where the switching preparation process recipe operation group is associated with a warm-up and/or test process recipe.

S132: Control the etching machine to execute the warm-up and/or test process recipe until the target etching chamber satisfies the requirement of the switching rule.

S133: Control the etching machine to automatically switch to the target hybrid process recipe operation group associated with the reserved process recipe.

Specifically, referring to FIG. 2, when different etching gases are used to etch films of different materials, different by-products will be generated, and the by-products will be deposited on the inner wall of the etching chamber. If these by-products are not removed before a process recipe is switched, it is easy to have an adverse effect on the new process recipe after switching. For example, the actual etching rate may be lower than the target etching rate, thereby reducing the etching efficiency and yield. Before switching the process recipe, the etching chamber is warmed up to ensure that the determined target etching chamber satisfies the requirements of the reserved process recipe and the switching rule. Then, the etching machine is controlled to automatically switch to the target hybrid process recipe operation group to execute the reserved process recipe.

Figure 3:
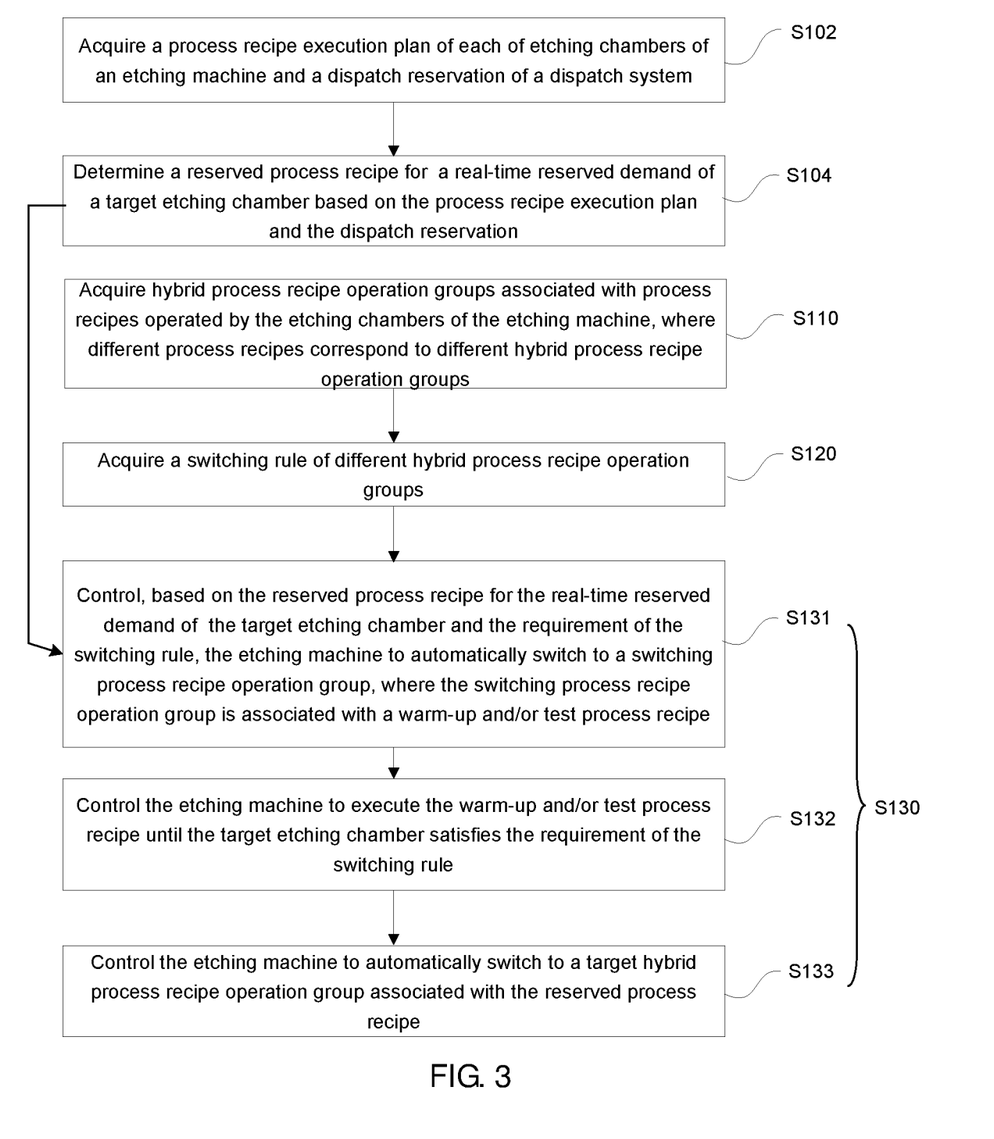
FIG. 3 is a flowchart of a control method for hybrid process recipes according to a third embodiment of the present disclosure.

Further, referring to FIG. 3, in an embodiment of the present disclosure, the control method for hybrid process recipes further includes:

S102: Acquire a process recipe execution plan of each of the etching chambers and a dispatch reservation of the dispatch system.

S104: Determine the reserved process recipe for the real-time reserved demand of the target etching chamber based on the process recipe execution plan and the dispatch reservation.

Specifically, a scheduling system may be configured to determine a scheduling plan, and the dispatch system may be configured to make a dispatch reservation. The manufacturing execution system may acquire the process recipe execution plan of each of the etching chambers and the dispatch reservation of the dispatch system, and determine the reserved process recipe for the real-time reserved demand of the target etching chamber based on the process recipe execution plan and the dispatch reservation, so as to acquire the target hybrid process recipe operation group associated with the reserved process recipe.

As an example, in an embodiment of the present disclosure, after S104, the control method further includes:

S105: Determine whether the process recipe associated with the target hybrid process recipe operation group of the current target etching chamber includes the reserved process recipe.

S106: If yes, control, based on the requirements of the reserved process recipe and the switching rule, the etching machine to automatically switch to the target hybrid process recipe operation group associated with the reserved process recipe.

Specifically, after determining the reserved process recipe for the real-time reserved demand of the target etching chamber, it is determined whether the process recipe associated with the target hybrid process recipe operation group of the current target etching chamber includes the reserved process recipe. If yes, based on the requirement of the switching rule, the etching machine is controlled to automatically switch to the target hybrid process recipe operation group associated with the reserved process recipe, so as to automatically switch to the target hybrid process recipe operation group within the etching chamber. If the process recipe associated with the target hybrid process recipe operation group of the current target etching chamber does not include the reserved process recipe, the etching machine is controlled to change the current target etching chamber, such that the etching machine is automatically switched to a target etching chamber corresponding to the target hybrid process recipe operation group associated with the reserved process recipe.

As an example, in an embodiment of the present disclosure, after S130, the control method further includes: control the target etching chamber to carry out production according to the reserved process recipe. By automatically switching the process recipe and performing production with the reserved process recipe according to the real-time reserved demand, the control method avoids manual operation, and improves the automation degree and operation efficiency of the etching process.

Figure 4:
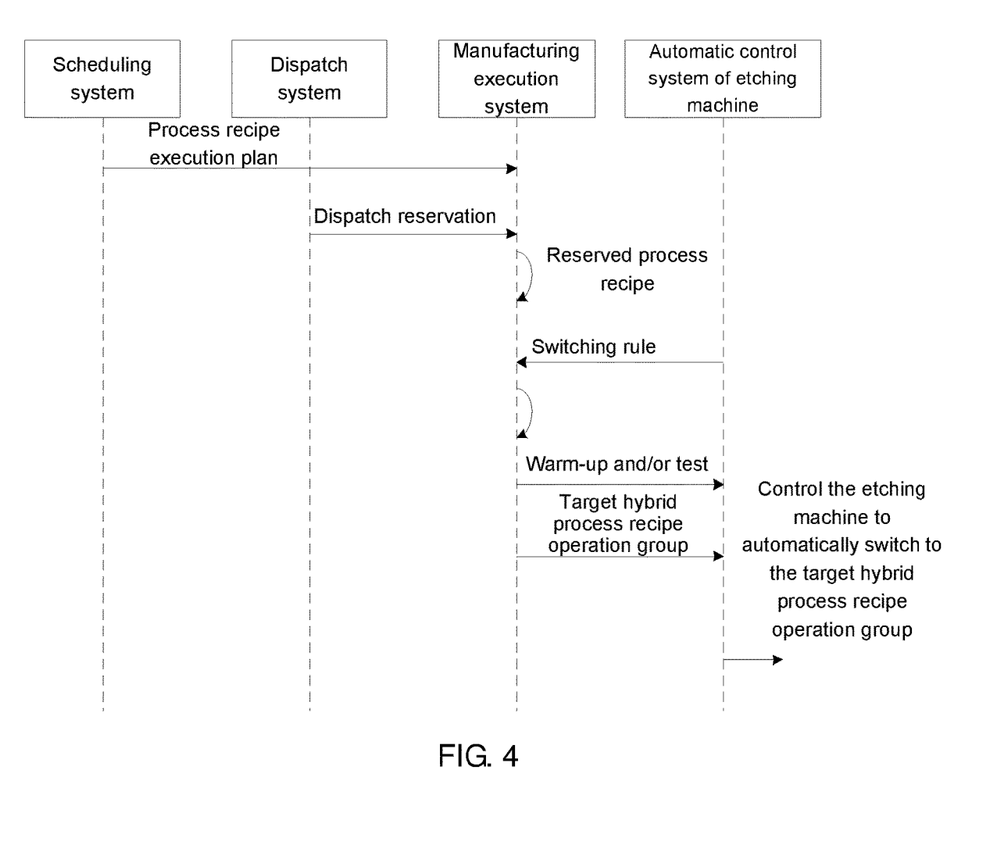
FIG. 4 shows an application scenario of the control method for hybrid process recipes according to a first embodiment of the present disclosure.

As an example, referring to FIG. 4, the scheduling system may determine the scheduling plan according to a production goal of the etching process in the semiconductor production line and a number of available etching machines. The dispatch system may issue a dispatch reservation according to a current production demand, that is, to issue a reservation request for an etching machine to the manufacturing execution system. The manufacturing execution system may acquire the process recipe execution plan of each of the etching chambers and the dispatch reservation of the dispatch system, and then determine a reserved process recipe for a real-time reserved demand of the target etching chamber based on the process recipe execution plan and the dispatch reservation. The manufacturing execution system may control the etching machine to warm up and/or test the etching chamber before switching the process recipe, so as to ensure that the determined target etching chamber satisfies the requirements of the reserved process recipe and the switching rule. Then, the manufacturing execution system may control the etching machine to automatically switch to the target hybrid process recipe operation group, and control the target etching chamber to carry out production according to the reserved process recipe. By automatically switching the process recipe and performing production with the reserved process recipe according to the real-time reserved demand, the control method avoids manual operation and improves the automation degree and operation efficiency of the etching process. After determining the reserved process recipe for the real-time reserved demand of the target etching chamber, the manufacturing execution system determines whether the process recipe associated with the target hybrid process recipe operation group of the current target etching chamber includes the reserved process recipe. If yes, according to the requirement of the switching rule, the manufacturing execution system controls the etching machine to automatically switch to the target hybrid process recipe operation group associated with the reserved process recipe, so as to automatically switch to the target hybrid process recipe operation group within the etching chamber. If the process recipe associated with the target hybrid process recipe operation group of the current target etching chamber does not include the reserved process recipe, the manufacturing execution system controls the etching machine to change the target etching chamber, such that the etching machine is automatically switched to the target etching chamber corresponding to the target hybrid process recipe operation group associated with the reserved process recipe.

Figure 5:
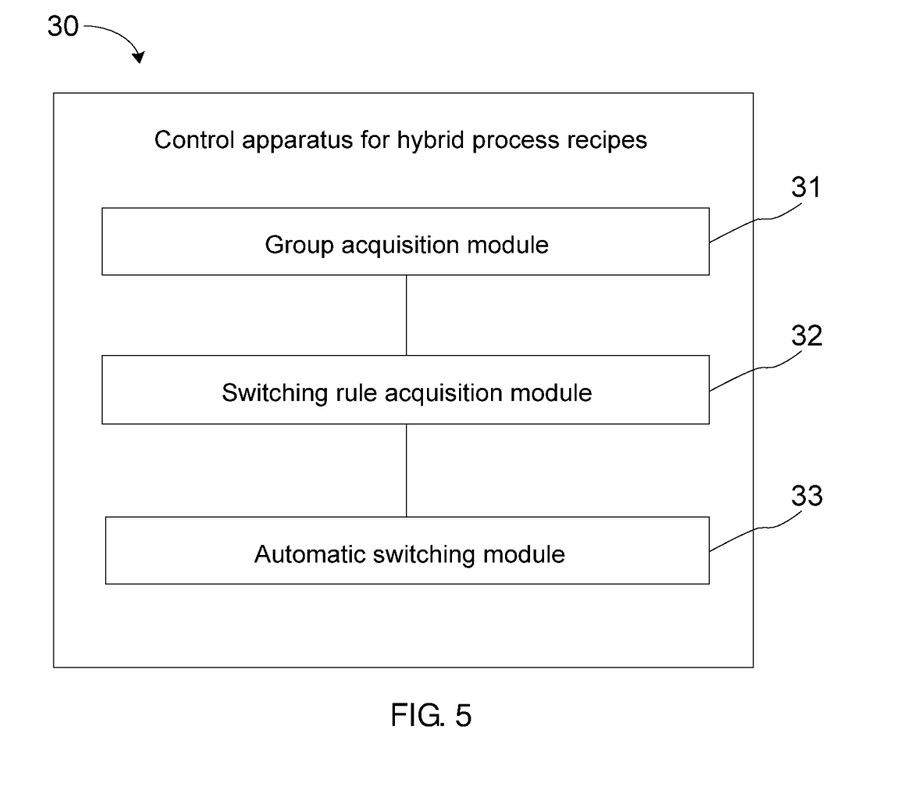
FIG. 5 is a structural view of a control apparatus for hybrid process recipes according to a first embodiment of the present disclosure.

Referring to FIG. 5, an embodiment of the present disclosure provides a control apparatus 30 for hybrid process recipes, including a group acquisition module 31, a switching rule acquisition module 32 and an automatic switching module 33. The group acquisition module 31 is configured to acquire hybrid process recipe operation groups associated with process recipes operated by etching chambers of an etching machine, where different process recipes correspond to different hybrid process recipe operation groups. The switching rule acquisition module 32 is configured to acquire a switching rule of different hybrid process recipe operation groups. The automatic switching module 33 is configured to control, based on a reserved process recipe for a real-time reserved demand of a target etching chamber and a requirement of the switching rule, the etching machine to automatically switch to a target hybrid process recipe operation group associated with the reserved process recipe.

As an example, in an embodiment of the present disclosure, the switching rule may be set to include: an etching rate of the target etching chamber is within a target etching rate range required by the reserved process recipe; and/or a particle content of the target etching chamber is within a target particle content range required by the reserved process recipe.

Figure 6:
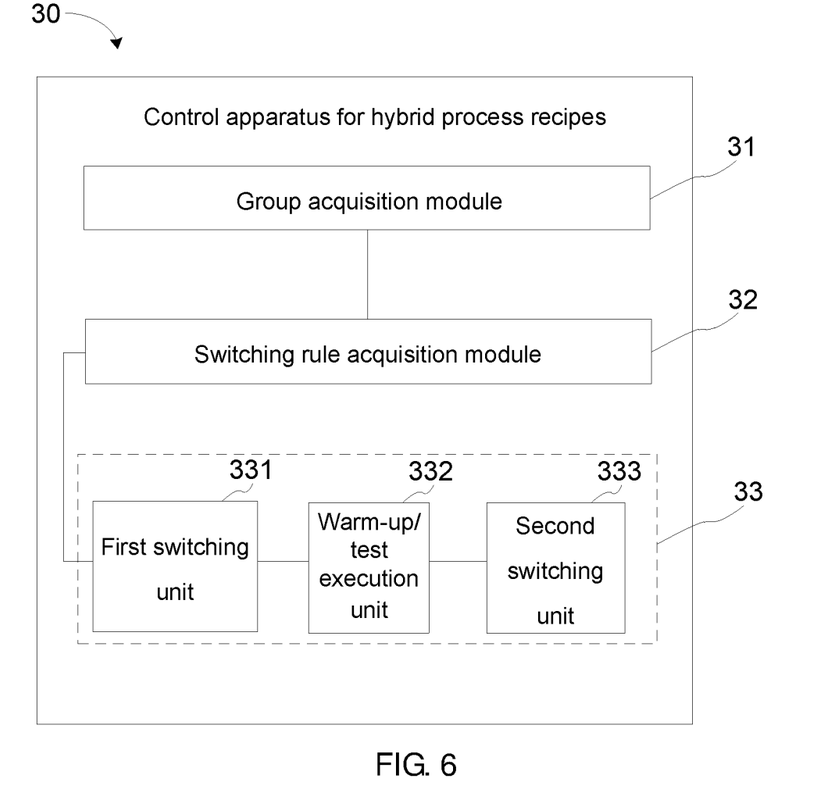
FIG. 6 is a structural view of a control apparatus for hybrid process recipes according to a second embodiment of the present disclosure.

As an example, referring to FIG. 6, in an embodiment of the present disclosure, the automatic switching module 33 includes a first switching unit 331, a warm-up/test execution unit 332 and a second switching unit 333. The first switching unit 331 is configured to control, based on the reserved process recipe for the real-time reserved demand of the target etching chamber and the requirement of the switching rule, the etching machine to automatically switch to a switching process recipe operation group, where the switching process recipe operation group is associated with a warm-up and/or test process recipe. The warm-up/test execution unit 332 is configured to control the etching machine to execute the warm-up and/or test process recipe until the target etching chamber satisfies the requirement of the switching rule. The second switching unit 333 is configured to control the etching machine to automatically switch to the target hybrid process recipe operation group associated with the reserved process recipe.

Figure 7:
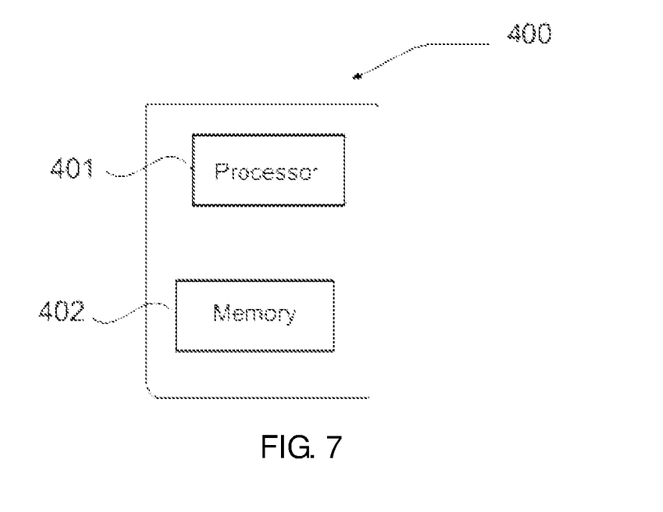
FIG. 7 is a block diagram of a control apparatus for hybrid process recipes according to an exemplary embodiment.

An exemplary embodiment of the present disclosure provides a control apparatus for hybrid process recipes. Referring to FIG. 7, the control apparatus 400 for hybrid process recipes may be provided as a terminal device. The control apparatus 400 may include a processor 401, and one or more processors may be set as required. The control apparatus 400 may further include a memory 402 configured to store an executable instruction, such as an application program, of the processor 401. One or more memories may be set as required. The memory may store one or more application programs. The processor 401 is configured to execute the instruction to perform the foregoing method. In an exemplary embodiment, a non-transitory computer-readable storage medium including instructions is provided. Referring to FIG. 7, for example, the non-transitory computer-readable storage medium may be the memory 402 including instructions. The foregoing instructions may be executed by the processor 401 of control apparatus 400 for hybrid process recipes to complete the foregoing method. For example, the non-transitory computer-readable storage medium may be a ROM, a RAM, a CD-ROM, a magnetic tape, a floppy disk, an optical data storage device, or the like. The present disclosure is described with reference to the flowcharts and/or block diagrams of the method, the apparatus (device), and the computer program product according to the embodiments of the present disclosure. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, such that the instructions executed by a computer or a processor of any other programmable data processing device generate an apparatus for implementing a specific function in one or more processes in the flowcharts and/or in one or more blocks in the block diagrams.

These computer program instructions may also be stored in a computer readable memory that can instruct the computer or any other programmable data processing device to work in a specific manner, such that the instructions stored in the computer readable memory generate an artifact that includes an instruction apparatus. The instruction apparatus implements a specific function in one or more processes in the flowcharts and/or in one or more blocks in the block diagrams.

These computer program instructions may also be loaded onto a computer or another programmable data processing device, such that a series of operations and steps are performed on the computer or the another programmable device, thereby generating computer-implemented processing. Therefore, the instructions executed on the computer or the another programmable device provide steps for implementing a function specified in one or more processes in the flowcharts and/or in one or more blocks in the block diagrams.

In the control apparatus for hybrid process recipes, the computer device or the computer-readable storage medium in the above embodiments, the group acquisition module 31 acquires a hybrid process recipe operation group associated with the process recipe operated by the etching chamber in the etching machine, where different process recipes correspond to different hybrid process recipe operation groups. The switching rule acquisition module 32 acquires the switching rule of different hybrid process recipe operation groups. Then, the automatic switching module 33 controls the etching machine to automatically switch to a target hybrid process recipe operation group associated with a reserved process recipe, based on the reserved process recipe for the real-time reserved demand and the requirement of the switching rule. The switching process does not require manual participation and does not require the etching machine to stop operating the process recipe, so as to avoid economic losses caused by machine shutdown, manual operation errors or omissions during process recipe switching. Since different process recipes correspond to different hybrid process recipe operation groups, during a dispatch reservation period of a dispatch system, a process recipe that does not belong to the target hybrid process recipe operation group corresponding to the target etching chamber cannot be successfully reserved. This avoids the problem that a target etching chamber determined by an automatic reservation does not correspond to the reserved process recipe for a real-time reserved demand, thereby avoiding production loss.

Although the steps in the flowcharts of FIGS. 1 to 3 are sequentially displayed according to the arrows, these steps are not necessarily executed in the order indicated by the arrows. Unless clearly described otherwise, the execution order of the steps is not strictly limited, and these steps may be executed in other orders. Moreover, at least some of the steps shown in FIGS. 1 to 3 may include a plurality of sub-steps or stages. The sub-steps or stages are not necessarily executed at the same time, but may be executed at different times. The execution order of the sub-steps or stages is not necessarily carried out sequentially, but may be executed alternately with other steps or at least some of the sub-steps or stages of other steps.

Those of ordinary skill in the art may understand that all or some of the procedures in the methods of the above embodiments may be implemented by a computer program instructing related hardware. The computer program may be stored in a non-volatile computer-readable storage medium. When the computer program is executed, the procedures in the embodiments of the above methods may be performed. Any reference to a memory, storage, database or other medium used in the various embodiments of the present disclosure may include a non-volatile and/or volatile memory.

It should be noted that the above embodiments are merely for the purpose of description instead of limiting the present disclosure.

The embodiments of this specification are described in a progressive manner, and each embodiment focuses on differences from other embodiments. The same or similar parts between the embodiments may refer to each other.

The technical features of the above embodiments can be employed in arbitrary combinations. In an effort to provide a concise description of these embodiments, all possible combinations of all technical features of the embodiments may not be described; however, these combinations of technical features should be construed as disclosed in the description as long as no contradiction occurs.

The above described are merely several embodiments of the present disclosure. Although these embodiments are described specifically and in detail, they should not be construed as a limitation to the patent scope of the present disclosure. It should be noted that those of ordinary skill in the art may further make variations and improvements without departing from the concept of the present disclosure. These variations and improvements should fall within the protection scope of the present disclosure. Therefore, the protection scope of the present disclosure should be subject to the protection scope defined by the appended claims.

The invention claimed is:

1. A method for controlling hybrid process recipes, comprising:
   acquiring hybrid process recipe operation groups associated with process recipes operated by etching chambers of an etching machine, wherein different process recipes correspond to different hybrid process recipe operation groups;
   acquiring a switching rule of the different hybrid process recipe operation groups; and
   controlling, based on a reserved process recipe for a real-time reserved demand of a target etching chamber and a requirement of the switching rule, the etching machine to automatically switch to a target hybrid process recipe operation group associated with the reserved process recipe;
   wherein the switching rule comprises at least one of:
      an etching rate of the target etching chamber is within a target etching rate range required by the reserved process recipe; or
      a particle content of the target etching chamber is within a target particle content range required by the reserved process recipe.

2. The method for controlling hybrid process recipes according to claim 1, wherein the switching rule comprises: a target etching rate on a silicon nitride film is 44 Å/min to 46 Å/min.

3. The method for controlling hybrid process recipes according to claim 1, wherein the controlling, based on a reserved process recipe for a real-time reserved demand of a target etching chamber and a requirement of the switching rule, the etching machine to automatically switch to a target hybrid process recipe operation group associated with the reserved process recipe comprises:
   controlling, based on the reserved process recipe for the real-time reserved demand of the target etching chamber and the requirement of the switching rule, the etching machine to automatically switch to a switching process recipe operation group, wherein the switching process recipe operation group is associated with at least one of a warm-up process recipe or a test process recipe;
   controlling the etching machine to execute the at least one of the warm-up process recipe or the test process recipe until the target etching chamber satisfies the requirement of the switching rule; and
   controlling the etching machine to automatically switch to the target hybrid process recipe operation group associated with the reserved process recipe.

4. The method for controlling hybrid process recipes according to claim 3, wherein after the controlling the etching machine to automatically switch to the target hybrid process recipe operation group associated with the reserved process recipe, the method for controlling hybrid process recipes further comprises:
   controlling the target etching chamber to carry out production according to the reserved process recipe.

5. The method for controlling hybrid process recipes according to claim 1, further comprising:
   acquiring a process recipe execution plan of each of the etching chambers and a dispatch reservation of a dispatch system; and
   determining the reserved process recipe for the real-time reserved demand of the target etching chamber based on the process recipe execution plan and the dispatch reservation.

6. The method for controlling hybrid process recipes according to claim 5, wherein after the determining the reserved process recipe for the real-time reserved demand of the target etching chamber, the method for controlling hybrid process recipes further comprises:
   determining whether a process recipe associated with the target hybrid process recipe operation group of a current target etching chamber comprises the reserved process recipe; and
   in response to determining that the process recipe associated with the target hybrid process recipe operation group of the current target etching chamber comprises the reserved process recipe, controlling, based on the reserved process recipe and the requirement of the switching rule, the etching machine to automatically switch to the target hybrid process recipe operation group associated with the reserved process recipe.

7. The method for controlling hybrid process recipes according to claim 6, wherein after the determining the reserved process recipe for the real-time reserved demand of the target etching chamber, the method for controlling hybrid process recipes further comprises:
in response to determining that the process recipe associated with the target hybrid process recipe operation group of the current target etching chamber does not comprise the reserved process recipe, controlling the etching machine to change the current target etching chamber.

8. The method for controlling hybrid process recipes according to claim 1, wherein process recipes for a same film are associated with a same hybrid process recipe operation group.

9. The method for controlling hybrid process recipes according to claim 1, wherein the etching machine comprises a plurality of different etching chambers.

10. An apparatus for controlling hybrid process recipes, comprising:
one or more processors; and
a storage apparatus, configured to store one or more programs, wherein the one or more programs, when executed by the one or more processors, cause the one or more processors to execute:
acquiring hybrid process recipe operation groups associated with process recipes operated by etching chambers of an etching machine, wherein different process recipes correspond to different hybrid process recipe operation groups;
acquiring a switching rule of the different hybrid process recipe operation groups; and
controlling, based on a reserved process recipe for a real-time reserved demand of a target etching chamber and a requirement of the switching rule, the etching machine to automatically switch to a target hybrid process recipe operation group associated with the reserved process recipe;
wherein the switching rule comprises at least one of:
an etching rate of the target etching chamber is within a target etching rate range required by the reserved process recipe; or
a particle content of the target etching chamber is within a target particle content range required by the reserved process recipe.

11. The apparatus for controlling hybrid process recipes according to claim 10, wherein the one or more programs cause the one or more processors to execute:
controlling, based on the reserved process recipe for the real-time reserved demand of the target etching chamber and the requirement of the switching rule, the etching machine to automatically switch to a switching process recipe operation group, wherein the switching process recipe operation group is associated with at least one of a warm-up process recipe or a test process recipe;
controlling the etching machine to execute the at least one of the warm-up process recipe or the test process recipe until the target etching chamber satisfies the requirement of the switching rule; and
controlling the etching machine to automatically switch to the target hybrid process recipe operation group associated with the reserved process recipe.

12. The apparatus for controlling hybrid process recipes according to claim 11, wherein the one or more programs cause the one or more processors to execute:
controlling the target etching chamber to carry out production according to the reserved process recipe.

13. The apparatus for controlling hybrid process recipes according to claim 10, wherein the one or more programs cause the one or more processors to execute:
acquiring a process recipe execution plan of each of the etching chambers and a dispatch reservation of a dispatch system; and
determining the reserved process recipe for the real-time reserved demand of the target etching chamber based on the process recipe execution plan and the dispatch reservation.

14. The apparatus for controlling hybrid process recipes according to claim 13, wherein the one or more programs cause the one or more processors to execute:
determining whether a process recipe associated with the target hybrid process recipe operation group of a current target etching chamber comprises the reserved process recipe; and
in response to determining that the process recipe associated with the target hybrid process recipe operation group of the current target etching chamber comprises the reserved process recipe, controlling, based on the reserved process recipe and the requirement of the switching rule, the etching machine to automatically switch to the target hybrid process recipe operation group associated with the reserved process recipe.

15. The apparatus for controlling hybrid process recipes according to claim 14, wherein the one or more programs cause the one or more processors to execute:
in response to determining that the process recipe associated with the target hybrid process recipe operation group of the current target etching chamber does not comprise the reserved process recipe, controlling the etching machine to change the current target etching chamber.

16. A non-transitory computer-readable storage medium, wherein the non-transitory computer-readable storage medium stores a computer program; and the computer program is executed by a processor to implement:
acquiring hybrid process recipe operation groups associated with process recipes operated by etching chambers of an etching machine, wherein different process recipes correspond to different hybrid process recipe operation groups;
acquiring a switching rule of the different hybrid process recipe operation groups; and
controlling, based on a reserved process recipe for a real-time reserved demand of a target etching chamber and a requirement of the switching rule, the etching machine to automatically switch to a target hybrid process recipe operation group associated with the reserved process recipe;
wherein the switching rule comprises at least one of:
an etching rate of the target etching chamber is within a target etching rate range required by the reserved process recipe; or
a particle content of the target etching chamber is within a target particle content range required by the reserved process recipe.

17. The non-transitory computer-readable storage medium according to claim 16, wherein the computer program is executed by the processor to implement:

controlling, based on the reserved process recipe for the real-time reserved demand of the target etching chamber and the requirement of the switching rule, the etching machine to automatically switch to a switching process recipe operation group, wherein the switching process recipe operation group is associated with at least one of a warm-up process recipe or a test process recipe;

controlling the etching machine to execute the at least one of the warm-up process recipe or the test process recipe until the target etching chamber satisfies the requirement of the switching rule; and controlling the etching machine to automatically switch to the target hybrid process recipe operation group associated with the reserved process recipe.

18. The non-transitory computer-readable storage medium according to claim 14, wherein the computer program is executed by the processor to implement:

acquiring a process recipe execution plan of each of the etching chambers and a dispatch reservation of a dispatch system; and determining the reserved process recipe for the real-time reserved demand of the target etching chamber based on the process recipe execution plan and the dispatch reservation.

19. The non-transitory computer-readable storage medium according to claim 16, wherein the computer program is executed by the processor to implement:

determining whether a process recipe associated with the target hybrid process recipe operation group of a current target etching chamber comprises the reserved process recipe; and in response to determining that the process recipe associated with the target hybrid process recipe operation group of the current target etching chamber comprises the reserved process recipe, controlling, based on the reserved process recipe and the requirement of the switching rule, the etching machine to automatically switch to the target hybrid process recipe operation group associated with the reserved process recipe.

20. The non-transitory computer-readable storage medium according to claim 17, wherein the computer program is executed by the processor to implement:

in response to determining that the process recipe associated with the target hybrid process recipe operation group of the current target etching chamber does not comprise the reserved process recipe, controlling the etching machine to change the current target etching chamber.

* * * * *